US011753718B2

(12) United States Patent
Arl et al.

(10) Patent No.: US 11,753,718 B2
(45) Date of Patent: Sep. 12, 2023

(54) SIO₂ THIN FILM PRODUCED BY ATOMIC LAYER DEPOSITION AT ROOM TEMPERATURE (71) Applicant: LUXEMBOURG INSTITUTE OF SCIENCE AND TECHNOLOGY (LIST), Esch-sur-Alzette (LU)

(72) Inventors: Didier Arl, Metz (FR); Noureddine Adjeroud, Luxembourg (LU); Damien Lenoble, Wellin (BE)

(73) Assignee: Luxembourg Institute of Science and Technology (LIST), Esch-sur-Alzette (LU)

( * ) Notice: Subject to any disclaimer, the term of this patent is extended or adjusted under 35 U.S.C. 154(b) by 9 days.

(21) Appl. No.: 17/352,523

(22) Filed: Jun. 21, 2021

(65) Prior Publication Data

US 2021/0310121 A1 Oct. 7, 2021

Related U.S. Application Data (62) Division of application No. 15/751,389, filed as application No. PCT/EP2016/068899 on Aug. 8, 2016, now Pat. No. 11,041,238.

(30) Foreign Application Priority Data

Aug. 10, 2015 (LU) .......................... 92795

(51) Int. Cl.
*C23C 16/455* (2006.01)
*C23C 16/40* (2006.01)

(52) U.S. Cl.
CPC ...... *C23C 16/45534* (2013.01); *C23C 16/402* (2013.01); *C23C 16/45527* (2013.01)

(58) Field of Classification Search
CPC .................. H01L 21/02164; C23C 16/45527
See application file for complete search history.

(56) References Cited

U.S. PATENT DOCUMENTS

| 4,239,811 A | 12/1980 | Kemlage |
| 2004/0005408 A1 | 1/2004 | Kiryu et al. |

(Continued)

FOREIGN PATENT DOCUMENTS

EP 1925691 A1 5/2008

OTHER PUBLICATIONS

Science.278.5345.1934 Klaus Dec. 1997 p. 1934-36 V278, No. 5345 (Year: 1997).*

(Continued)

*Primary Examiner* — Joseph A Miller, Jr.
(74) *Attorney, Agent, or Firm* — Sandberg Phoenix & von Gontard PC (57) ABSTRACT A method for atomic layer deposition for the deposition of silicon oxide on a substrate, performed at room temperature, involving at least three precursors, being silicon tetrachloride, water and one Lewis base agent, being in various instances ammonia. The process comprises the steps of exposing on the substrate during an exposure time (a) the one Lewis base agent, (b) the silicon tetrachloride, and (c) the water. The process is remarkable in that at least one step of purge with nitrogen gas is performed after each of the steps (a), (b) and (c) during a purge time. Additionally, a film of silicon oxide which is remarkable in that it comprises a low level of chlorine contaminant and a significant degree of porosity with pores, the pores being in various instances micropores, mesopores or nanopores.

5 Claims, 11 Drawing Sheets (56) References Cited

U.S. PATENT DOCUMENTS

| | | | |
|---|---|---|---|
| 2006/0134331 A1 | 6/2006 | Thompson | |
| 2006/0286810 A1* | 12/2006 | Delabie | C23C 28/042 118/724 |
| 2008/0317972 A1 | 12/2008 | Hendriks et al. | |
| 2011/0236575 A1 | 9/2011 | King et al. | |

OTHER PUBLICATIONS

International Search Report for corresponding PCT/EP2016/068899 dated Nov. 14, 2016.
Du et al: "SiO2 film growth at low temperatures by catalyzed atomic layer deposition in a viscous flow reactor", Thin Solid Films, Elsevier-Sequoia S.A. Lausanne, CH,vol. 491, No. 1-2, Nov. 22, 2005 (Nov. 22, 2005), pp. 43-53.
Frosch et al: "Surface Protection and Selective Masking during Diffusion in Silicon", Journal of the Electrochemical Society Sep. 1957, vol. 104, No. 9, pp. 547-552.
Olsson et al: "Passive films on stainless steels—chemistry, structure and growth", Electrochimica Acta 48 (2003) 1093/1104.
Ragesh et al: A Review on 'Self-cleaning and Multifunctional Materials', Journal of Materials Chemistry A, 2013, 00, 1-3, pp. 1-24.
Park et al: "Superhydrophobicity of 2D SiO2 hierarchical micro/nanorod structures fabricated using a two-step micro/nanosphere lithography", Journal of Materials Chemistry, 2012, 22, 14035-14041.
Gao et al: "Highly Transparent and UV-Resistant Superhydrophobic SiO2-Coated ZnO Nanorod Arrays", American Chemical Society, Appl. Mater. & Interfaces 2014, 2219-2223.
Xu et al: "Preparation of superhydrophobic cotton fabrics based on SiO2 nanoparticles and ZnO nanorod arrays with subsequent hydrophobic modification", Elsevier, Surface & Coatings Technology 204 (2010) 1556-1561.

Klaus et al: "Growth of SiO2 at Room Temperature with the Use of Catalyzed Sequential Half-Reactions", Science, vol. 278, Dec. 12, 1997, 1934-1936.
Wang et al: Comprehensive understanding of the effect of electric dipole at high-k/SiO 2 interface on the flatband voltage shift in metal-oxide semiconductor device, AIP, Applied Physics Letters 97, 062901-1-062901-03 (2010).
Dingemans et al: "Controlling the fixed charge and passivation of Si(100)/Al2O3 interfaces using ultrthin SiO2 interlayers synthesized by atomic layer deposition", Journal of Applied Physics, 110, 093715-1-09375-6 (2011).
Kim et al: "Electrical Properties of Bulk Silicon Dioxide and SiO2/Si Interface Formed by Tetraethylorthosilicate-Ozone Chemical Vapor Deposition", Journal of the Electrochemical Society, 147 (4) 1473-1476 (2000).
Klaus et al: "Atomic Layer Deposition of SiO2 Using Catalyzed and Uncantalyzed Self-Limiting Surface Reactions", Surface Review and Letters, vol. 6, Nos. 3 & 4 (1999) 435-448.
Damyanov et al: "On the Mechanism of Interaction Between TiCl4 Vapour and Surface OH Groups of Amorphous SiO2", Journal of Non-Crystalline Solids, 105 (1988) 107-113.
Klaus et al: "Atomic layer deposition of SiO2 at room temperature using NH3-catalyzed sequential surface reactions", Surface Science 447 (2000) 81-90.
Ritala et al: "Perfectly Conformal TiN and Al2O3 Films Deposited by Atomic Layer Deposition", Chemical Vapor Deposition 1999, 5, No. 1, 7-9.
Puurunen "Random Deposition as a Growth Mode in Atomic Layer Deposition", Chemical Vapor Deposition 2004, 10, No. 3, 159-170.
Huang et al: "Superhydrophilicty of TiO2/SiO2 thin films: Synergistic effect of SiO2 and phase-separation-induced porous structure", Surface & Coatings Technology 213 (2012) 126-132.
Mazur et al: "TiO2/SiO2 multilayer as an antireflective and protective coating depsoited by microwave assisted magnetron sputtering", Opto-Electronics Review 21(2), 233-238.

* cited by examiner

| Name | At % | At % depth profiling |
|---|---|---|
| SiO₂ / TiO₂ / Si | | |
| Si 2p | 16.39 | - |
| O 1s | 58.76 | 63.41 |
| N 1s | 1.4 | - |
| Cl 2p | 1.13 | 3.79 |
| C 1s | 14.66 | - |
| Ti | 7.66 | 32.8 |
| SiO₂ / Si | | |
| Si 2p | 25.61 | 34.38 |
| O 1s | 60.45 | 62.86 |
| N 1s | 1.55 | 2.27 |
| Cl 2p | 1.03 | 0.48 |
| C 1s | 10.95 | <1 |

SIO₂ THIN FILM PRODUCED BY ATOMIC LAYER DEPOSITION AT ROOM TEMPERATURE

CROSS-REFERENCE TO RELATED APPLICATIONS

This application is a divisional of U.S. patent application Ser. No. 15/751,389 filed on Feb. 8, 2018, which is a US national stage under 35 U.S.C. § 371 of International Application No. PCT/EP2016/068899, was filed on Aug. 8, 2016, and which claims the priority of application LU 92795 filed on Aug. 10, 2015, the content of which (text, drawings and claims) are incorporated here by reference in its entirety.

FIELD

The invention is directed to the field of deposition of silicon oxide on a substrate, notably an inorganic material.

BACKGROUND

Silicon dioxide ($SiO_2$) and more generally oxide ultrathin films have been widely described as good components in modern nanotechnologies like dielectric material in silicon microelectronic devices [Frosch C. J., et al., *J. Electrochem. Soc.,* 1957, 104, 547-552], anticorrosion films [Olsson C. O. A., et al., *Electrochim. Acta,* 2003, 48, 1093-1104] or non-exhaustive applications of nanoscale films in catalysis. The environmentally and human safe state of $SiO_2$ induces its wide use in protective layers for antisticking, antifogging, self-cleaning or water repellency. For instance, various techniques such as chemical vapor deposition [Ragesh P., et al., *J. Mater. Chem. A.,* 2014, 2, 14773-14797], lithographic patterning [Park H. K., et al., *J. Mat. Chem.,* 2012, 22, 14035-14041], electrochemical deposition [Gao Y., et al., *ACS App. Mat. & Inter.,* 2014, 6, 2219-2223] or sol-gel [Xu B., et al, *Surf Coat. Techno.,* 2010, 204, 1556-1561] are investigated to elaborate superhydrophobic $SiO_2$ through the tuning of surface roughness or energy. $SiO_2$ is consistently known for protective or gate insulator coatings [Klaus J. W., et al, *Science,* 1997, 278, 1934-1936], interfacing high-κ materials [Wang X., et al., *Appl. Phys. Lett.,* 2010, 97, 062901-062903] or surface passivation [Dingemans G., et al., *J. Appl. Phys.,* 2011, 110, 09371-093716].

The increasing demand for transparent active materials in the nanoscale justifies the need of a deposition technique compatible with sensitive pre-deposited underlying layer, flexible plastic devices or high aspect ratio substrates. Therefore, Atomic Layer Deposition (ALD) is considered as one of the most suitable technique for its performances in terms of sub-nanometer thickness control and penetration coating into deep trenches or mesoporous structures.

Although the improvement $SiO_2$ coatings obtained at high temperatures engaged a lot of efforts towards ALD parameters or precursors, the question of the deposition at room temperature nevertheless emerged. George et al. described many times this atomic layer-controlled growth using $SiCl_4$ and $H_2O$ [Du Y., et al., *Thin Solid Films,* 2005, 491, 43-53]. They demonstrated that a catalysed reaction using Lewis bases such as pyridine or ammonia avoid large precursor fluxes and can only occur close to room temperature. Nevertheless, in these reported studies, pyridine or ammonia was never really considered as a "precursor". The proposed mechanism that considered the hydrogen bonding between the Lewis base and either the SiOH* surface species or the $H_2O$ reactant was studied by considering the global residual pressure of a continuous flow of catalyst. Moreover, since a pollution of the film through the inclusion of contaminants arise through the secondary reaction of pyridine or ammonia with the byproduct HCl, a sequential approach could enhance the quality of the film and the understanding of the role of the catalyst.

Silicium oxide ($SiO_2$) films made at room temperature have been described as feasible by the exposition of two reactants (A and B) through a sequential exposition (ABAB . . . ). Many well-known precursors require high deposition temperatures, plasma or highly reactive co-reactant such as ozone gas [Kim H. U., et al., *J. Electrochem. Soc.,* 2000, 147, 1473-1476]. Nearly correlated to CVD-based processes and despite a low enthalpy of reaction, silicium tetrachloride ($SiCl_4$) usually reacts with water (oxidant specie) at high temperatures (>325° C.) [Klaus J. W., et al, *Science,* 1997, 278, 1934-1936]. A comparison of thermal ALD and room temperature processes reveal a higher growth rate/ALD cycle in favour of room temperature reactions (~2 Å/cycle).

George et al described the mechanism that spontaneously takes place through a catalysed binary reactions using pyridine or ammonia as a Lewis base agent [Klaus J. W., et al, *Surf Rev. Lett.,* 1999, 6, 435-448]. The hydrogen bonding between the Lewis base and SiOH* (surface specie) or $H_2O$ allows the reaction to be performed at room temperature. Compared to high temperature processes that use large exposures (>103 Torr.s), $SiO_2$ room temperature ALD is permitted trough the strong nucleophile attack of the oxygen from (i) SiOH* on $SiCl_4$ and (ii) from $H_2O$ on SiCl* [Du Y., et al, *Thin Solid Films,* 2005, 491, 43-53].

Nevertheless, according to our knowledge, no specific data have been described regarding the variation of the chemical composition and the morphology of such films. Based on the catalytic effect of $NH_3$, it can be clearly deduced that a constant flow of $NH_3$ statistically ensures a maximized reaction of —O on all —O—Si—$(Cl)_n$ available sites. Nonetheless, the perfect delimitation of the exposure windows at room temperature could be enhanced by working in a non-conventional high vacuum state (<$10^{-6}$ Torr). As it may not be the case for standard ALD reactors like in our case, we tried to understand and control the mechanism of contaminants inclusion in this regime. Thus, the state-of-the-art production of $SiO_2$ at room temperature (~25° C.) using a constant flow of $NH_3$ has been compared to pulse $NH_3$-catalysed RT-ALD.

Inspired by the reactivity of chlorinated precursors described in the literature [Damyanov D., et al, *J. Non-Cryst. Solids,* 1988, 105, 107-113], the amount of contamination could be cautiously explained by the functionality x of the adsorbed 137 specie at the surface explained hereafter:

$x(\equiv Si-OH)+SiCl_4 \rightarrow (\equiv Si-O)_x SiCl_{4-x}+xHCl$ x=1: monofunctional
x=2: bifunctional
X=3: trifunctional The injected precursor $SiCl_4$ reacts with the surface hydroxyl species. The competition between the single bond case (x=1) and multiple bonds (1<x≤3) is directly linked to the stagnancy of precursors in the ALD regime. As far as the concentration of hydroxyl groups on the surface is increased, the saturation of $H_2O$ will directly enhance the formation of HCl. Concurrently with the constant flow of ammonia, the ~2.2 Si/N ratio measured by XPS in the bulk of the film also indicates that strong nitrogen contamination exceed acceptable limits, especially through the inclusion of $NH_4Cl$ salts. As indicated by George et al. [Klaus J. W., et al., *Surf Sci.,* 2000, 447, 81-90], this salt is formed as a result of the $NH_3$ catalyst complexing with the HCl reaction product. Due to the vapour pressure of $NH_4Cl$ salt (i.e. $4.10^{-5}$ Torr), some quantity of salts are remained inside the film. In that context, it is noteworthy that compared to an inert gas, using $NH_3$ in a carrier gas mode may not contribute to a pure ALD process performed at room temperature.

SUMMARY

The invention has for technical problem to provide porous silicon oxide layers with a significant decrease of the amount of contaminants, such as chlorine, included in the film.

The invention is directed to a process of atomic layer deposition for the coating of silicon oxide on a substrate, notably an inorganic material, performed at room temperature, involving at least three precursors, the at least three precursors being silicon tetrachloride, water and one Lewis base agent, the one Lewis base agent being in various instances ammonia. The process comprises the steps of (a) exposing on the substrate during an exposure time the one Lewis base agent, (b) exposing on the substrate during an exposure time the silicon tetrachloride, and (c) exposing on the substrate during an exposure time the water. The process is remarkable in that at least one step of purge with nitrogen gas is performed after each of the steps (a), (b) and (c) during a purge time.

In various embodiments, the at least one step of purge with nitrogen gas presents a ratio of nitrogen gas flow/total pressure which is inferior to 5 Torr, 4 Torr, 3 Torr, 2 Torr or 1 Torr, in various instances inferior to 2 Torr.

In various embodiments, the exposure time of the precursors is comprised between 50 milliseconds and 200 seconds.

In various embodiments, the exposure time of the silicon tetrachloride is comprised between 50 milliseconds and 200 milliseconds, in various instances comprised between 80 milliseconds and 120 milliseconds, for example of 100 milliseconds; and the exposure time of the Lewis base agent and of the water is comprised between 1 second and 3 seconds, in various instances comprised between 1.8 seconds and 2.2 seconds, for example of 2.0 seconds.

In various embodiments, the exposure time of the precursors is comprised between 50 seconds and 200 seconds, in various instances comprised between 70 seconds and 99 seconds, for example of 71, 72, 73, 74, 75, 76, 77, 78, 79, 80, 81, 82, 83, 84, 85, 86, 87, 88, 89, 90, 91, 92, 93, 94, 95, 96, 97 or 98 seconds, e.g., of 90 seconds.

In various embodiments, the purge time with nitrogen gas is comprised between 1 second and 20 seconds, in various instances comprised between 5 seconds and 15 seconds, for example of 10 seconds.

In various embodiments, the purge time with nitrogen gas after step (a) is comprised between 100 seconds and 240 seconds, in various instances comprised between 160 seconds and 200 seconds, for example of 180 seconds; the purge time with nitrogen gas after step (b) is comprised between 10 seconds and 100 seconds, in various instances comprised between 40 seconds and 80 seconds, for example of 60 seconds; and the purge time with nitrogen gas after step (c) is comprised between 200 seconds and 360 seconds, in various instances comprised between 280 seconds and 320 seconds, e.g., of 300 seconds.

In various embodiments, the steps (a), (b) and (c) with concomitant purge steps are repeated between 50 and 5000 times, in various instances between 500 and 2500 times.

In various embodiments, the inorganic material is composed of silicon, silicon oxide, titanium, titanium oxide, aluminium, aluminium oxide, zinc, zinc oxide or any combinations thereof, or any other, in various instances silicon.

In various embodiments, the silicon materials are cleaned in accordance with RCA procedure before the steps of exposing.

In various embodiments, the process is carried out in a reactor which is equipped with a residual gas analyser adapted for determining the exposure time and the purge time.

In various embodiments, the reactor is further equipped with a quartz crystal microbalance adapted for the gravimetric monitoring of the film growth and/or a mass spectrometer adapted for monitoring the gas composition.

The invention is further directed to a film of silicon oxide obtained by the process as described in the first part of the present invention. The film of silicon oxide is remarkable in that it comprises a level of chlorine contaminant which is inferior to 5%, 4%, 3%, 2% or 1% of the total mass of the film of silicon oxide, preferably inferior to 3% of the total mass of the film of silicon oxide.

In various embodiments, the film of silicon oxide comprises pores, the pores being in various instances micropores, mesopores or nanopores (i.e. <50 nm).

In various embodiments, the film of silicon oxide comprises superhydrophilic properties, anti-reflective properties and/or insulating properties.

The invention is particularly interesting in that the correlation of the high aspect ratio and the oxygen concentration exhibits a super-hydrophilic behaviour. The silicon oxide thin films of the present invention further manifest a weak conductivity. The optimized room temperature ALD (RT-ALD) process can further be applied on a wide range of substrates that need to be 3D-coated with a low-κ porous silicon oxide layer or any 3D temperature-sensitive materials requiring super-hydrophilic treatments.

DETAILED DESCRIPTION

ALD processes were performed in a TFS200-Beneq reactor in the planar configuration at a base pressure of 0.3 mbar. SiO$_2$ thin films were deposited on silicon substrates preliminary cleaned with a standard RCA procedure. The deposition reactor is equipped with a quartz crystal microbalance, QCM, (Neyco) for the gravimetric monitoring of the film growth. The QCM was fixed at the central part of the substrate holder. A quadrupole mass spectrometer, Vision-2000C, MKS-instrument, was mounted at the outlet of the deposition reactor to monitor the exhaust gas composition. SiO$_2$ thin films were obtained at room temperature using silicon tetrachloride (SiCl$_4$) and water (H$_2$O) as precursors. Vaporized precursors were transferred to the ALD reaction chamber with nitrogen (N$_2$) carrier gas. SiCl$_4$ precursor was purchased from Sigma Aldrich and used as received. Both canisters containing the precursors were maintained at 19° C. during deposition.

Morphology and thickness of the obtained samples were obtained on FEI Heliosnanolab 650 Focused Ion Beam Secondary Electron Microscope (FIB-SEM). The elemental composition depth profile was assessed by Dynamic Secondary Ion Mass Spectrometry (D-SIMS) (Cameca IMSLAM) while the quantification was performed by X-ray photoelectron spectroscopy (XPS) (Thermo VG Scientific, MicroLab 350) using an Al X-Ray source. The thickness, refractive index and reflectance were determined using the UVISEL spectroscopic phase modulated ellipsometer, Horiba scientific using a Cauchy function for analysis. The hydrophobic behaviors of the deposited films were determined by water contact angle (WCA) measurements using drops of water. Additionally, the dielectric properties of the films were determined using a Novolab broadband dielectric spectrometer.

As described by Klaus et al. [Klaus J. W., et al., *Surf Rev. Lett.*, 1999, 6, 435-448], the process described here above confirms that NH$_3$ gas molecule acts as a catalyst for the deposition of SiO$_2$ at room temperature (between 20° C. and 26° C.). Nevertheless, a significant contamination of the surface is coming from the excessive dose of ammonia. The contamination depicted here confirms the already described importance of adjusting the quantity of NH$_3$ to limit the reaction between HCl and NH$_3$. Thus, we considered that tuning the pulses of NH$_3$ like the other precursors could minimize unfavourable reactions at room temperature.

Based on the same chemistry used in the previous part, each chemical involved in the following process has been considered as a precursor. This means that an adequate separation of each pulsed chemical has been guaranteed. The purge of the reactor has been optimized using the appropriate ratio of carrier gas flow/total pressure (<2 Torr). Any overlapping between each precursor pulse has been prevented by checking the injection with the integrated Residual Gas Analyser (RGA).

Figure 1:
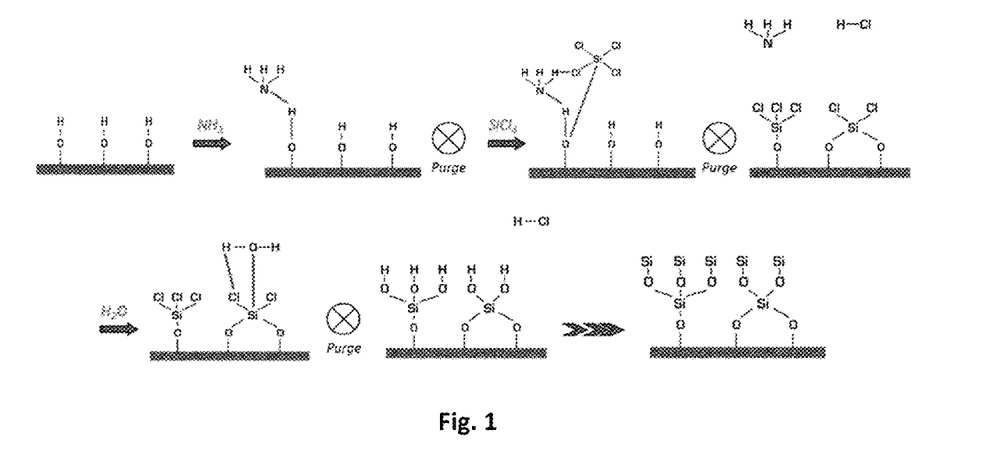
FIG. 1 exemplarily illustrates ALD room temperature growth of $SiO_2$ under $NH_3$ catalytic regime.

FIG. 1 depicts the growing of a SiO$_2$ monolayer. Through the injection of NH$_3$ (under catalytic regime), the 0-H bond becomes weaker, —Si can easily react with —O at the surface to form —O—Si—(Cl)$_3$ or —O—Si(Cl)$_2$—O— ligands at the surface. —O coming from water injection directly react with —Si to finally form a SiO$_2$ monolayer.

Figure 2:
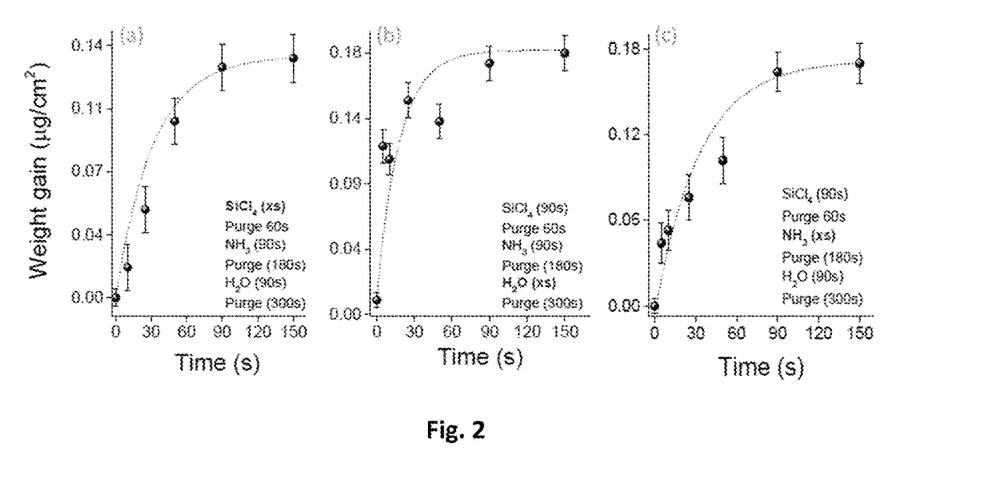
FIG. 2 exemplarily illustrates saturation curves of $SiCl_4$, $H_2O$ and $NH_3$ along the $SiO_2$ thin film growth. The growth kinetic is shown for 5 cycles sequential exposure of the surface.

FIG. 2 shows the ALD saturation curves at room temperature for SiCl$_4$, H$_2$O and NH$_3$ precursors. In our reactor configuration, primary experiments demonstrated that the saturation time for all precursors occurred between 60 s and 100 s. The timing sequence of the experiment starts with a variable SiCl$_4$ exposure followed by a 90 s N$_2$ purge. Next, a 90 s NH$_3$ exposure was followed by a 180 s N$_2$ purge. Lastly, the cycle was ended by a 90 s H$_2$O pulse and a longer N$_2$ purge of 300 s to ensure a complete release of the subsequent unabsorbed water. This value of 300 s has been validated by the RGA. FIG. 2a shows the mass gain versus exposure time for various $SiCl_4$ pulses switched from 500 ms to 150 s. The profile presents a saturation over t=90 s. A subsequent $SiCl_4$ exposure, not shown here for clarity, produce a smaller mass gain even no gain. This can be observed through the saturation of the curve over 90 s. The total weight gain resulting from 5 cycles is about 0.13 $\mu g/cm^2$. FIG. 2b shows the mass gain versus exposure time for various $H_2O$ pulses switched from 500 ms to 150 s. Starting with the previously obtained value for $SiCl_4$ (i.e. 90 s), the cycle is kept identical and a various $H_2O$ exposure time is applied. A maximum weight gain of 0.18 $\mu g/cm^2$ is reached for 90 s and the saturation regime is reached over this value. FIG. 2b shows the mass gain versus exposure time for various $NH_3$ pulses switched from 500 ms to 150 s. $SiCl_4$ and $H_2O$ are both maintained at 90 s, a maximum of 0.17 $\mu g/cm^2$ gain of mass is observed over 90 s $NH_3$ exposure. The trends observed in FIG. 2 were used to investigate the growth of a $SiO_2$ film in a pure ALD regime at room temperature. $SiCl_4$, $NH_3$ and $H_2O$ exposure times were fixed at 90 s and extended purges were applied after $NH_3$ and $H_2O$ pulses, respectively 180 s and 300 s. A purge for $SiCl_4$ lasting 60 s was applied.

Those finely tuned fluxes of precursors allow the surface reactions to perform smoothly and in particular, it allows a significant decrease of the amount of contaminants, such as chlorine, but also nitrogen, carbon and any others, which might be included in the silicon oxide thin film.

Figure 3:
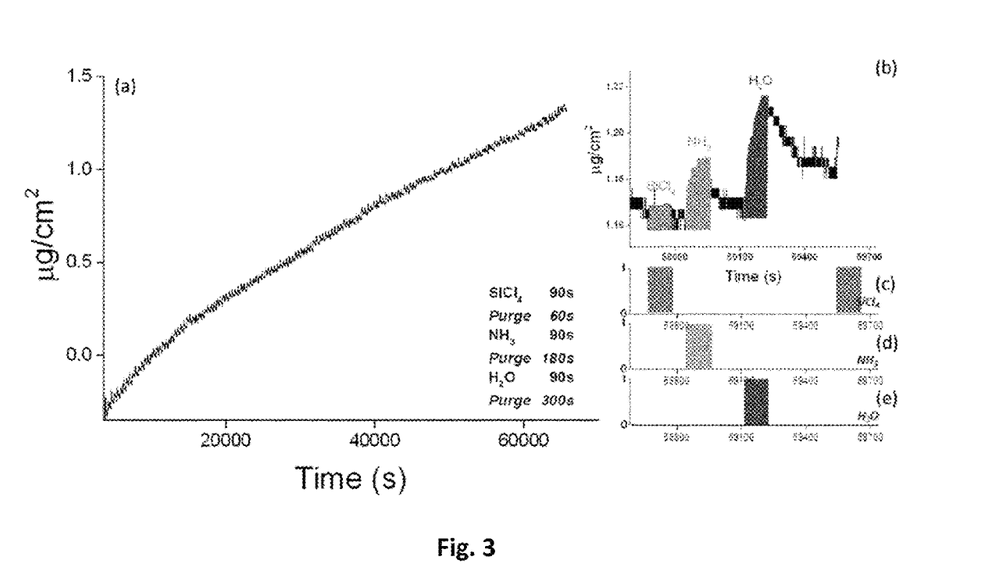
FIG. 3 exemplarily illustrates growth kinetics of pure ALD $SiO_2$ growth with sequential exposure of the surface to 90 s of $SiCl_4$, 90 s of $NH_3$ and 90 s of $H_2O$. A typical zoom of the in situ monitoring of 500 loops deposition shown in panel (a) corresponds to a growth rate of 0.02 μg/cm$^2$. The panel (b) represents a zoom of the 60% advanced deposition. Lower panels represent the programmed exposures of $SiCl_4$, $NH_3$ and $H_2O$, respectively.
Figure 4:
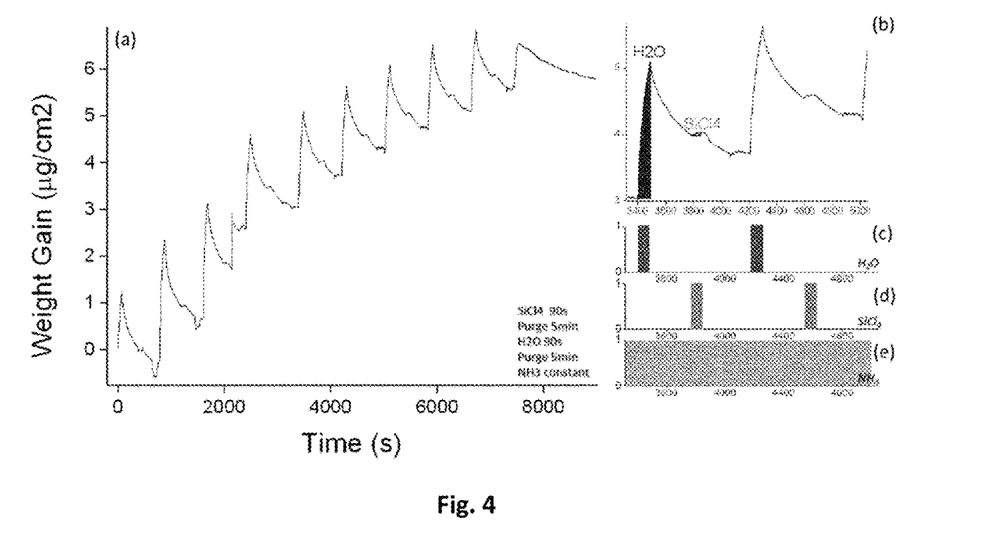
FIG. 4 exemplarily illustrates growth kinetics of $SiO_2$ for sequential exposure of the surface to 90 s of $SiCl_4$, and 90 s of $H_2O$, indicating a growth rate of 0.6 μg/cm$^3$ per cycle. Panel (a) shows a typical zoom on 10 cycles of the total 2000 cycles deposited film. Panel (b) corresponds to the view of 2 cycles deposition. Lower panel represent the programmed exposure of $H_2O$, $SiCl_4$ and $NH_3$, respectively.

As shown in FIG. 3, the 0.02 $\mu g/cm^2$ per cycle weight gain is 30 times lower than the process done with a constant flow of $NH_3$ (which is depicted in FIG. 4). Nevertheless, the injection of $NH_3$ and $H_2O$ precursors noteworthy contributes to a certain gain of mass (see FIG. 3b) and a growth rate of 0.5 Å/cycle is obtained for 500 cycles deposition (i.e. a higher mass is depicted for $H_2O$). This confirms that the interaction of $H_2O$ molecules with active complex of the surface ends through the efficient replacement of chlorine by hydroxyl groups (as shown in FIG. 1).

Figure 5:
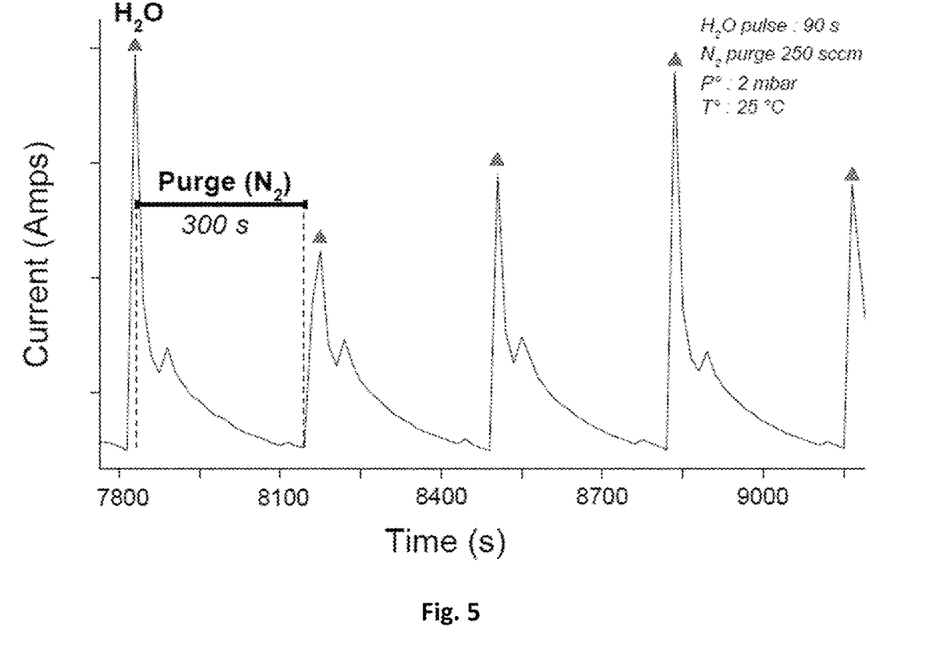
FIG. 5 exemplarily illustrates In-situ RGA mass spectrometric monitoring of successive 90 s $H_2O$ pulses alternated with 300 s $N_2$ purge. The panel corresponds to the measured intensity of $H_2O$ (m/z=18 uam) (uam=unified atomic mass).

In our case, the appropriate purging time of water has been determined by using a systematic variation using the RGA ($H_2O$: m/z=18 uam). The trend shown in FIG. 5 reveals a 300 s purge time needed to decrease down to the base line.

Figure 6:
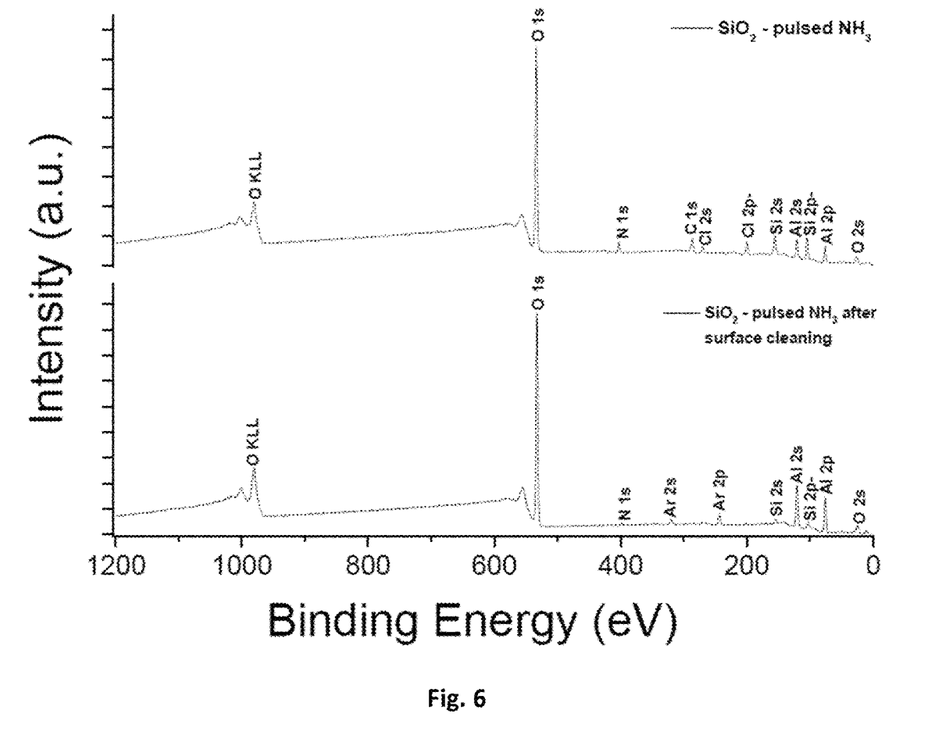
FIG. 6 exemplarily illustrates XPS spectra of $SiO_2$ thin film obtained with a sequential 90 s exposure of $SiCl_4$, $NH_3$ and H$_2$O precursors. Upper panel corresponds to the signal of the raw film and lower panel to the film after surface cleaning.

The XPS elemental analysis (FIG. 6) still shows the presence of chlorine, nitrogen and Carbon in addition of silicon and oxygen. The amount of contaminants is nonetheless substantially decreased. First, the Si/Cl ratio is going from ~4 (surface) to ~8.7 in the bulk of the film. Secondly, compared to the films obtained with a constant flow of ammonia, the Si/Cl ratio is significantly improved (8.7 versus 3). Moreover, the Si/N ratio is heightened from 1.1 to 3.8 (resp. 2.2 to 5.9 inside the film). This indicates a limited reaction between hydrogen chloride with ammonia to form ammonium chloride. High resolution fitting of N1 s reveals a single binding energy at 401.1±0.3 eV corresponding to $NH_3^+$. This confirms the formation of ammonium chloride salt. The small amount of detected Al is attributed to the alumina sub-layer (i.e. $SiO_2/Al_2O_3/Si$).

Figure 7:
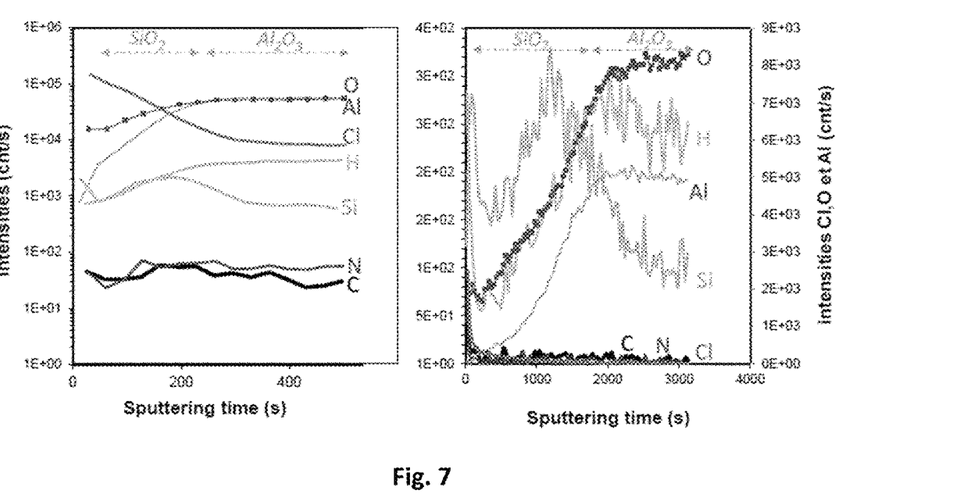
FIG. 7 exemplarily illustrates SIMS depth profile of pure ALD SiO$_2$ film obtained with 90 s pulse of SiCl$_4$, NH$_3$ and H$_2$O precursors and extended N$_2$ purges, respectively 60, 180 and 300 s. Fast and slow sputtering rate are shown respectively in panels (a) and (b).

The SIMS depth profile of the $SiO_2$ film is shown in FIG. 7. The intensity of chlorine is decreasing ~30 times faster than the process done with the constant $NH_3$ flow. In fact, less than 100 s sputtering are needed to decrease the intensity below 1 e5 cnts/s compared to ~2800 s for the $NH_3$ constant flow process. Additionally, the intensity of nitrogen seems to be in the same range of 10 to 100 cnts/s. Related to XPS results, this corroborates the formation of $NH_4Cl$ salt. The intensity of Si is nonetheless higher than Al, confirming the coating process of $SiO_2$ on $Al_2O_3$. Based on XPS and SIMS results, it can be assumed that this room-temperature process is optimized in terms of surface exposure. Nevertheless, residual traces of hydrochloric acid still react with ammonia due to the difficulties to purge water or ammonia at room temperature. Tittle by-products quantities, such as ammonium chloride, are consequently integrated into the film.

Figure 8:
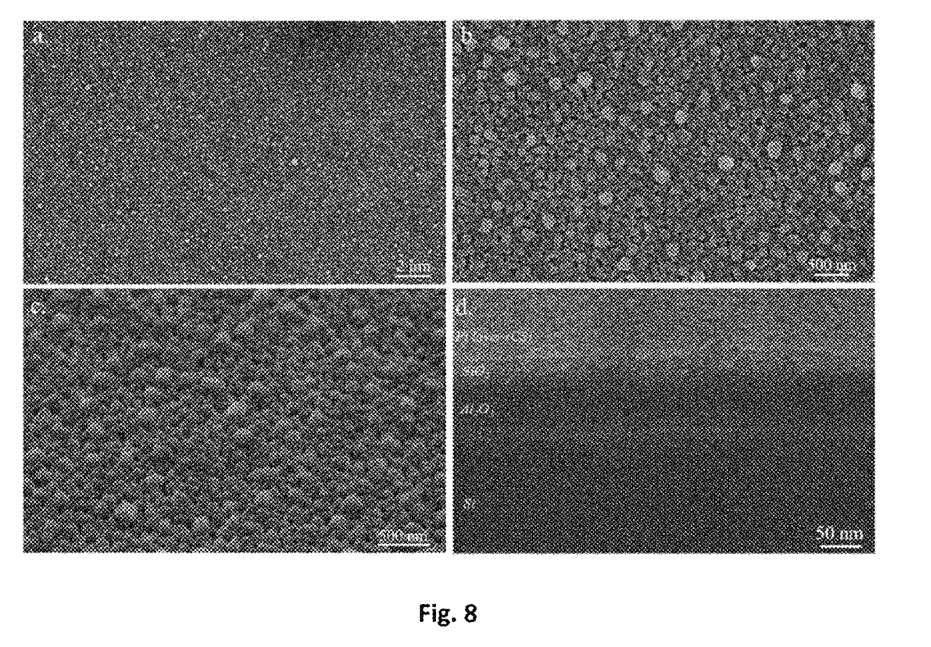
FIG. 8 exemplarily illustrates SEM images of the 500 cycles processed pure ALD SiO$_2$ film at different magnifications: (a) top and (b) 450 tilted view of the entire oxide film; (c, d) FIB cross-section images reveal a dense state of the SiO$_2$ film with an inhomogeneous crystallisation due to the unescapable inclusion of contaminants and the low growth rate of 0.5 Å/cycle.

FIG. 8 shows the top-view and cross-section SEM images of the $SiO_2$ film. We observe a porous layer with grains size up to 200 nm. A significant roughness is observed in the 450 tilted view (FIG. 8c). Additionally, cross-section analyses evidence an inhomogeneous crystallisation into the film (FIG. 8d). A thickness of ~30 nm±5 nm is measured through the cross-section, also confirming the ~25 nm value deduced from the SIMS pulverisation speed of silicon oxide. This lead to a low growth rate of ~0.5 Å/cycle related to the lower weight gain observed with the QCM (i.e. 30× lower than the $SiO_2$ film processed under a constant flow of ammonia). Nevertheless, the type of crystallisation reveals that the process is not corresponding to a pure ALD growth mode as expected [Ritala M., et al., *Chem. Vap. Depos.*, 1999, 5, 7-9]. This peculiar non-homogeneous growth at room temperature suggests that the surface reaction is in competition with the integration of contaminants. The self-limiting process actually promote the deposition of species onto the substrate and onto the deposits (e.g. islands, . . . ) with equal probability, if we consider that no particles can be produced in a CVD mode, then the inclusion of contaminants at a sub-atomic growth rate (i.e. <1 Å/cycle) could explain the morphology of the obtained film. Moreover, the high amount of hydrogen bonded terminal —OH groups could affect the dehydroxylation-rehydroxylation equilibrium leading to a higher quantity of HCl produced in the case of trifunctional bonds. Nevertheless, the oxide layer displays a significant density in volume and the amount of inhomogeneous crystallites is limited. This is in line with the sub-atomic growth rate mechanism surrounded by a limited contamination. The tailoring of the ALD parameters in this RT-$SiO_2$ growth process manifests a substantial adaptability in terms of morphology and chemical composition. These results let suggest that a tuning of the growth parameters could influence the crystallisation that occurs. Hence, different type of $SiO_2$ layers could be processed at room temperature.

Low contaminants $SiO_2$ can be produced by adjusting the surface exposure of $SiCl_4$, $NH_3$ and $H_2O$ precursors. Furthermore, the impact of a limited exposition to the composition and the morphology of the film has been carried out. Hence, the process has been tuned to maintain the low level of contaminants in an ALD non-saturation regime. The precursor exposure has been decreased to a minimum value for $SiCl_4$ (i.e. 100 ms) in agreement with a low contamination strategy. Then, according to RGA results, the exposure time of $NH_3$ and $H_2O$ has been fixed to 2 s for both with a purge of 10 s using 300 sccm of nitrogen.

Figure 9:
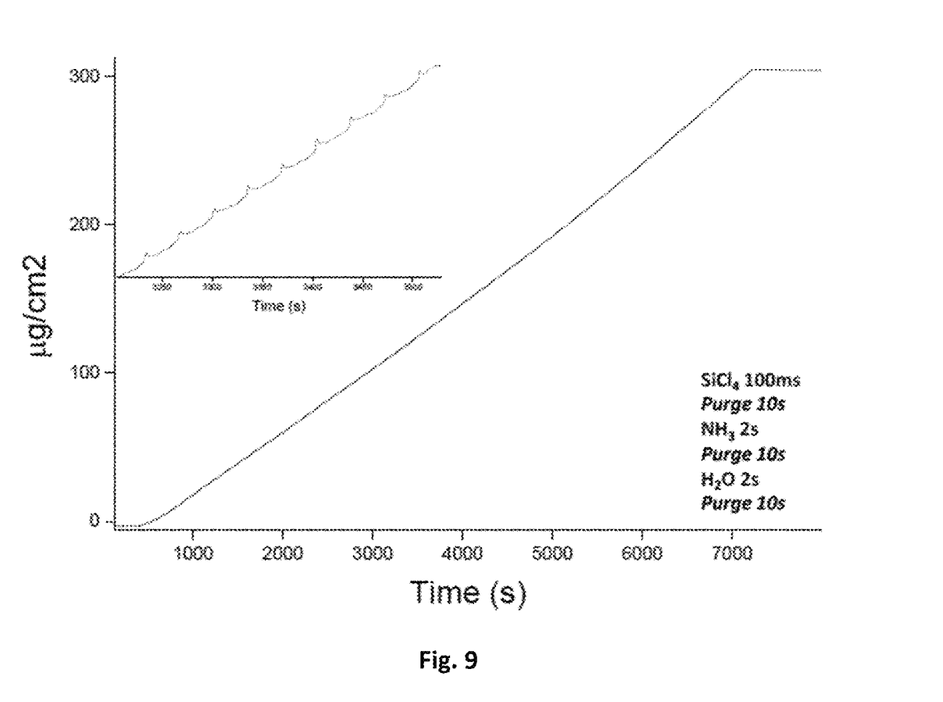
FIG. 9 exemplarily illustrates growth kinetics of porous SiO$_2$ growth with sequential exposure of the surface to 100 ms of SiCl$_4$, 2 s of NH$_3$ and 2 s of H$_2$O. The in situ monitoring of 300 loops deposition corresponds to a growth rate of 1.5 µg/cm$^2$ per cycle. The insert represents a zoom of 10 cycles process.

As shown in FIG. 9, a growth rate of 1.54 $\mu g/cm^2$ per cycle is obtained. Compared to the previous processes, the exposure reaction used here generates a ~50 times higher weight gain. In order to screen any physico-chemical influence from the substrate, silicon oxide films were performed by intercalating a pre-characterized barrier layer. Hence $SiO_2$ growth has been investigated on two different sub-layers, i.e. $TiO_2$ deposited by ALD and Si bulk.

Figure 10:
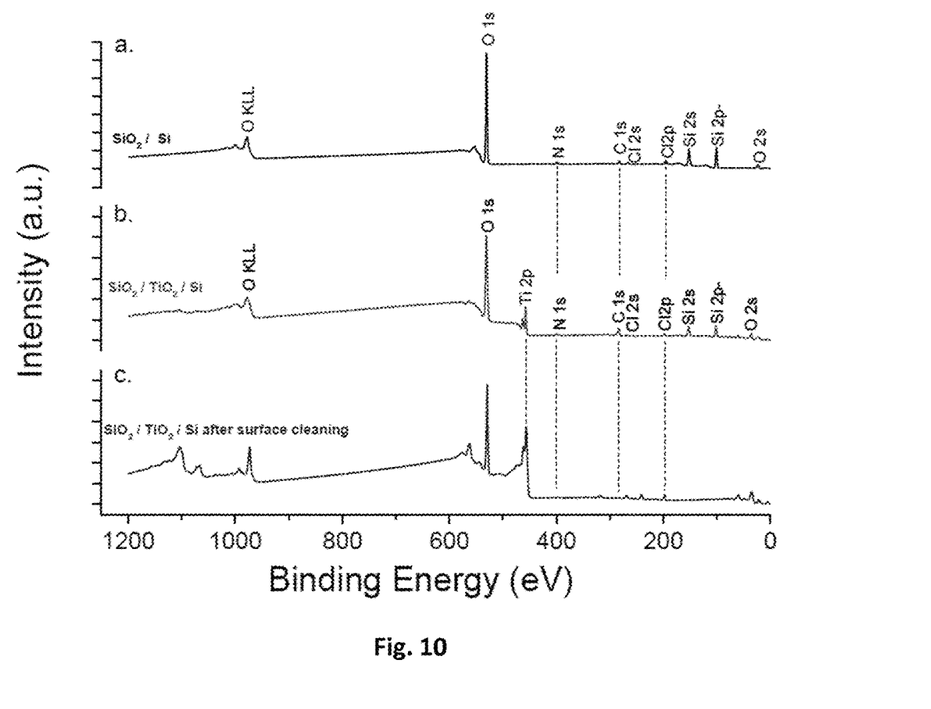
FIG. 10 exemplarily illustrates XPS spectra of SiO$_2$ thin film obtained with a sequential exposure of SiCl$_4$, NH$_3$ and H$_2$O precursors. SiO$_2$ film deposited on (a) Si wafer, (b, c) TiO$_2$/Si (80 nm) before and after surface cleaning respectively.
Figure 11:
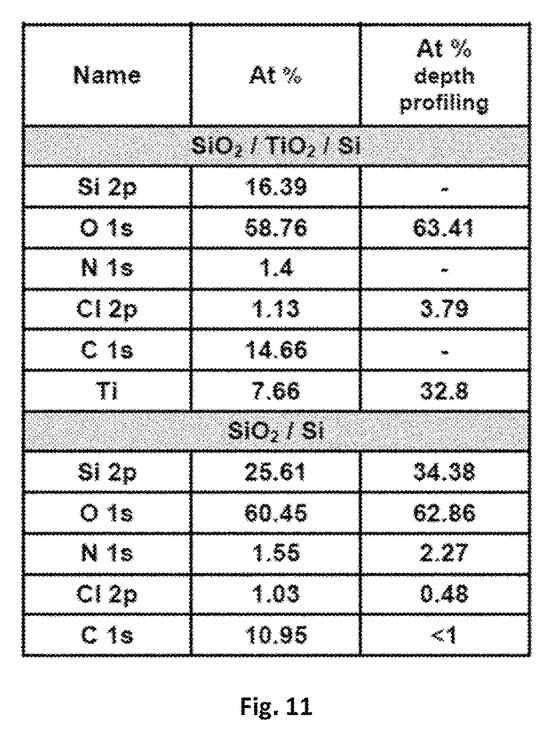
FIG. 11 exemplarily illustrates XPS quantification of the suitable element of the SiO$_2$ thin film obtained with an optimized ALD regime on a TiO$_2$/Si substrate (above) and a Si substrate (below).

FIG. 10 shows the XPS experiment results. As expected, Cl, C, N elements are detected for both samples. In the case of the oxide deposited on $TiO_2$, the detection of Ti-2p before cleaning confirms the low thickness of the film. However the percentage of chlorine is clearly maintained below the limit of 3% obtained for the previous process with extended exposures likewise N and C (FIG. 11). Nevertheless, chlorine concentration is increasing as far as the titanium oxide layer is reached through the sputtering. Since chlorine is inherent to the $TiO_2$ ALD elaboration, the chlorine concentration is effectively lower in the film as indicated by the deposit on Si directly (FIG. 11 —$SiO_2$/Si). In order to screen the composition and the porous structure of the film, thicker $SiO_2$ (2500 loops) has been processed on a layer without chlorine contamination, i.e. $Al_2O_3$ on Si (50 nm).

Figure 12:
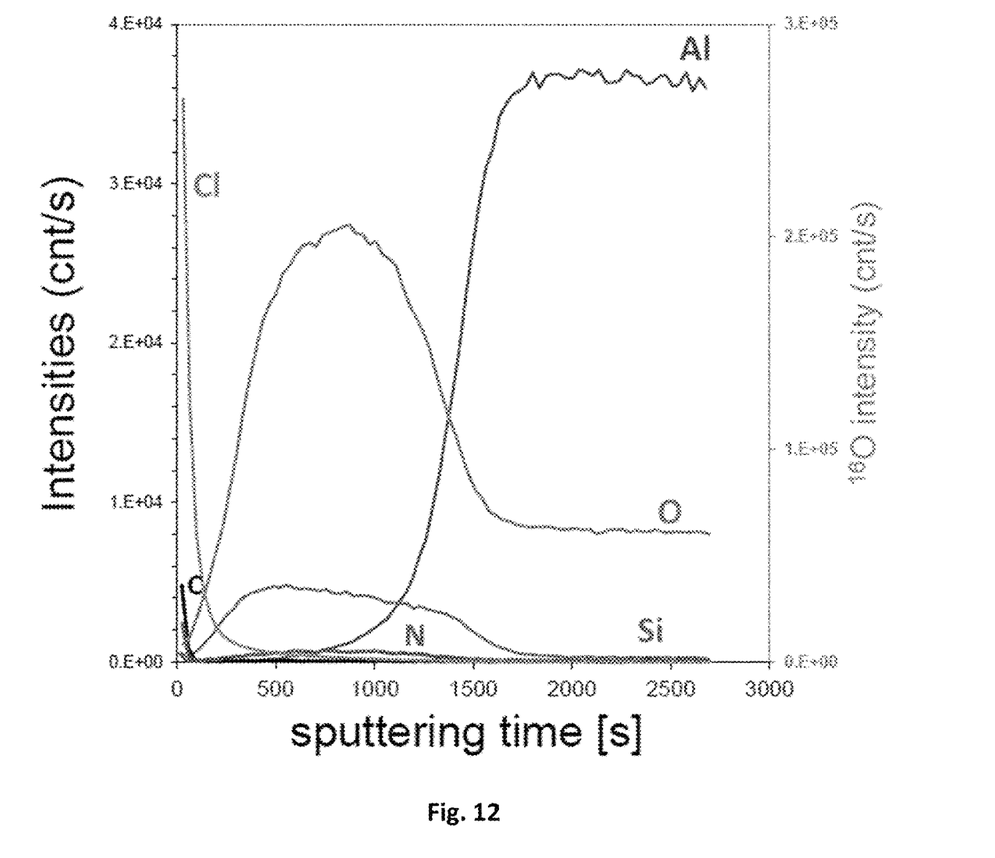
FIG. 12 exemplarily illustrates SIMS depth profile of porous SiO$_2$ film obtained with 100 ms pulse of SiCl$_4$, 2 s of NH$_3$, and H$_2$O precursors.

The SIMS depth profiling exhibits a concentration of chlorine that is rapidly decreasing as a function of the sputtering time (FIG. 12). Compared to the previous process, the intensity of Cl is starting a decade less, around 3.5 e4 cnts/s. The amount of C is moreover comparable but the N concentration is slightly increasing inside the film (~750 s sputtering time). This confirms the low level of $NH_4Cl$ contamination included in a thick volume of $SiO_2$. Additionally, the higher concentration of chlorine close to the surface of the film hint the slow dissociative chemisorption of water that induces the desorption of HCl. This recombination clearly affects the growth mechanism of silicon dioxide.

Figure 13:
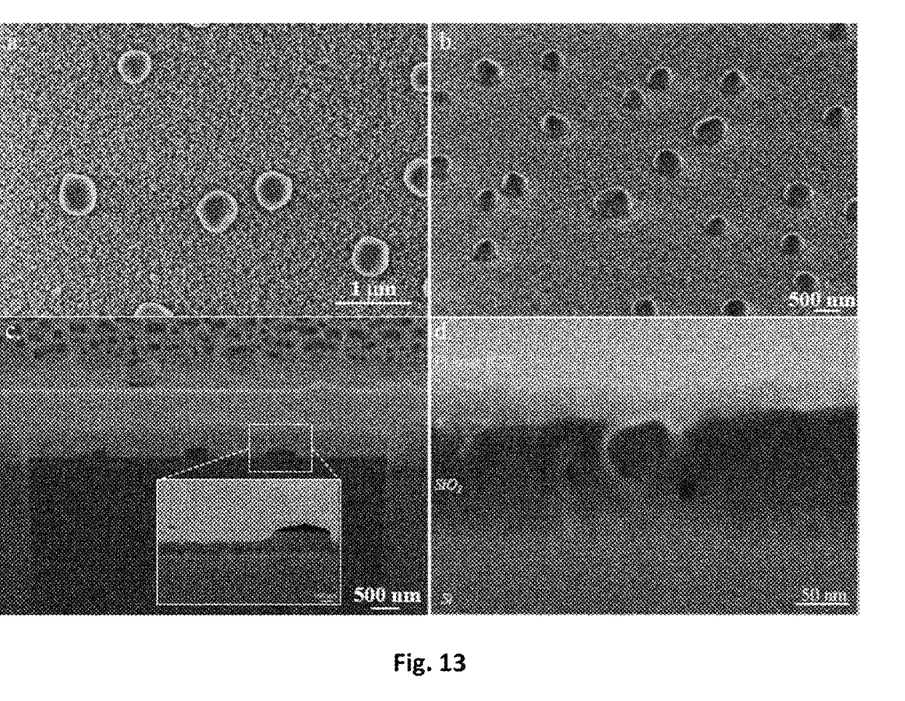
FIG. 13 exemplarily illustrates SEM images of the ~260 nm thick ALD SiO$_2$ (300 loops) film at different magnifications: (a) top and (b) 450 tilted view of the entire oxide film; (c, d) FIB cross-section confirms the porous state of the film.

As shown in FIG. 13, SEM analyses establish the porous state of the oxide film. Except the presence of 200 nm to 500 nm diameter aggregates on the surface of the layer, the top and tilted views (resp. FIGS. 13a and 13b) reveals directly a $SiO_2$ spongy nature. The applied FIB cross-section (FIGS. 13c and 13d) reveals also the presence of 20-50 nm cavities related to a porous film. Compared to the film obtained through the pure ALD process, it is worth notable that the mechanisms involved in this growth process generate alternatively hollow volume on behalf of the migration into surface crystallites. As explained in the ALD random deposition approach [Puurunen R. L., Chem. Vap. Dep., 2004, 10, 159-170], if the growth per cycle is not constant, the surface roughness should increase faster at the beginning of growth and slowly thereafter. This implies naturally that a smaller number of ALD reaction cycles are needed to fit a conformal deposition in a close-packed array as far as the growth rate is adjacent to an atomic monolayer.

By considering the growth rate of ~0.11 Å/cycle obtained in this process, this could explain why the $SiO_2$ film is much closed as the one processed under the pure ALD approach. Nevertheless, its spongy state may be related to surface diffusion that are (i) on one hand limited due to the room temperature reaction and (ii) on the other hand widely promote during extended purges during the pure ALD process. In that case, residual water or byproducts ($NH_4Cl$, HCl) are considered as surface fractions where the supplementary amount of injected precursor will be adsorbed, leading to a non-uniform film. This peculiar structure is nonetheless attractive for some applications that need to be processed at room temperature.

The performances have been checked for both $SiO_2$ dense and porous film.

Figure 14:
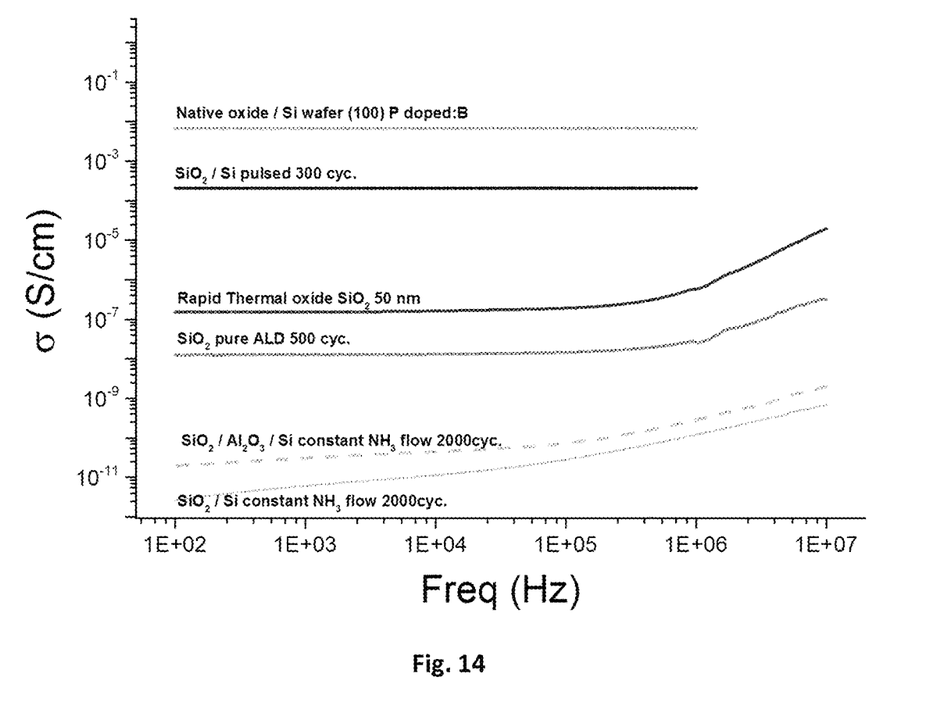
FIG. 14 exemplarily illustrates conductivity measurements of the porous SiO$_2$ film compared to a standard thermal oxide made by rapid thermal CVD (100 nm).

We investigated the dielectric characterizations on the $SiO_2$ films obtained in this work and we compared it to a standard thermal oxide (RTO; 1100° C.; 1 h). As shown in FIG. 14, the conductivity of the dense $SiO_2$ film obtained through the pure ALD is in the range of a 50 nm thermal oxide ($10^{-7}$-$10^{-8}$ S/cm). The conductivity measured for the dense $SiO_2$ is anyway ~$10^3$ higher than the standard oxide produced with a constant flow of $NH_3$ (~$10^{-11}$ S/cm). Furthermore, the thick porous $SiO_2$ exhibits a low conductivity of 200 µS/cm. This could be attributed to the amount of —OH groups associated to a specific area that is higher than in a compact film.

Despite its low-κ state, this porous $SiO_2$ layer could be used as transparent backside coating or as a first passivation layer. No additional transparent, such as $Al_2O_3$ for instance, layer has been added in order to demonstrate the inherent properties of the as-developed film.

The versatility of the ALD process allows the production of a tuneable low-κ layer at room temperature. This could be in line with many temperature-sensitive hybrid applications.

Figure 15:
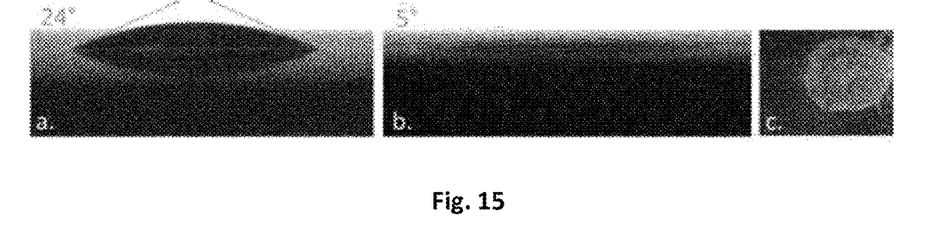
FIG. 15 exemplarily illustrates water contact angle images of (a) Si wafer, (b) porous SiO$_2$ and (c) top view of the substrate after depositing the water drop.

Hydrophilic or superhydrophilic surfaces can be created by tuning the roughness at the nanoscale or the porosity of a film. This is peculiar in various applications such as antibacterium, heat transfer or biomedical applications. Hence, the wettability of the film has been analysed by water contact angle (WCA) and results are shown in FIG. 15. Compared to the untreated silicon surface (FIG. 15a), the porous $SiO_2$ layer demonstrates a remarkable super-hydrophilic behaviour (<5°). According to the XPS analyses, this could be attributed to the high concentration of oxygen in the porous film which presents a significant aspect ratio. The interest of hydrophilic behaviour commonly based on $TiO_2$ for instance [Huang T., et al., Surf Coat. Techno., 2012, 213, 126-132) could be transposed to a standalone porous $SiO_2$ layer.

Figure 16:
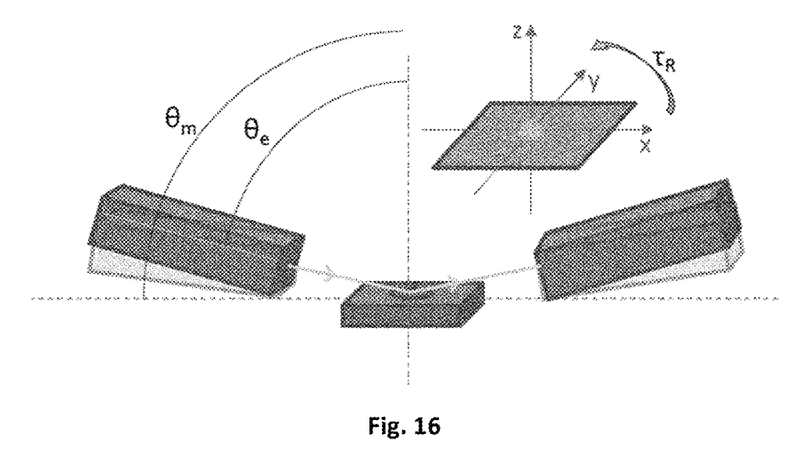
FIG. 16 exemplarily illustrates a schematic of the reflection ellipsometric measurements. The variable maximum angle $\theta_m$ is set at two different effective grazing angles $\theta_e$=75 and 81°. Data were acquired in the full wavelength range 350-1000 nm. The spatial reflectance has been measured by counterclockwise rotating the sample as a function of the planar angle $T_R$. Z-axis is fixed at zero to maximise the reflected intensity.
Figure 17:
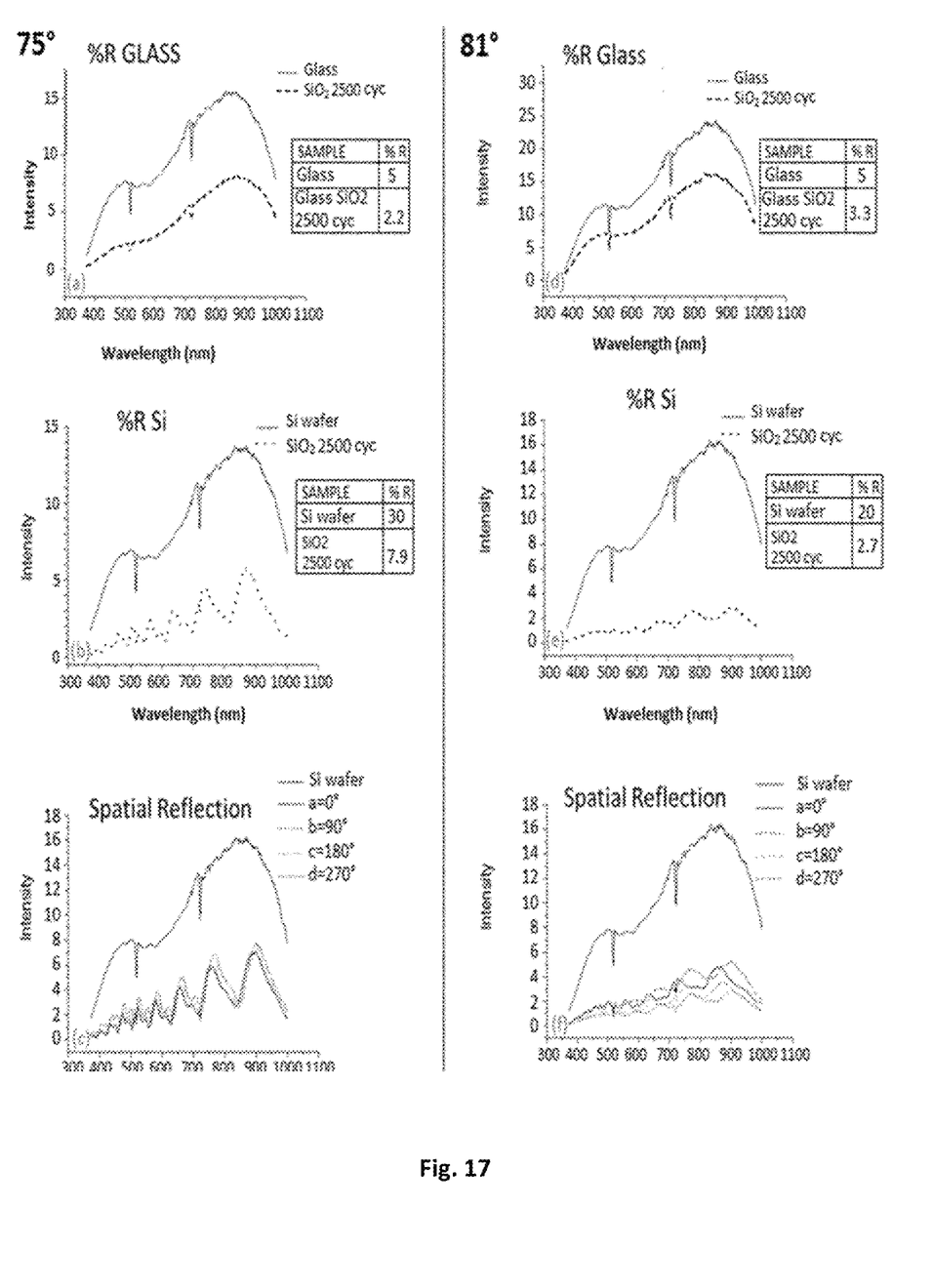
FIG. 17 exemplarily illustrates reflection results obtained by using the ellipsometer at two different grazing angles (respectively 750 and 81°). The reflectance percentage has been measured for SiO$_2$ deposited on glass (a, d) and silicon (b, e). The spatial reflection (c, f) confirms the homogeneity of the film with a limited variation of the signal as a function of the $\tau_R$ angle.

One of the other aspects of porous layer applications is the possibility to create anti-reflective coatings (ARC). The main advantage to add an anti-reflective layer on optically active device (i.e. solar cells) is to improve the efficiency [Mazur M., et al., Opto-Electron. Rev., 2013, 21, 233-238]. The reflectivity has been checked by ellipsometry with two grazing angles, i.e. 75 and 81 degrees (see FIG. 16). The specular reflection has been surrounded by a spatial reflectance analysis in order to validate the anisotropy of the film and the results are shown in FIG. 17. A remarkable decrease of the reflectance percentage is observed in both cases of coating glass or silicon. The signal is constantly decreasing as a function of the thickness of the film but only extreme results are shown here for clarity. As the reflectance reduction is about ~10-15% for Si, the scaling down for glass is maintained in the region of ~50% especially for high reflection at grazing angle for glass. The combination of the maintain of substantial reflection percentage at various incident angles with less than 200 nm coating gives a good opportunity to use this room temperature process in a wide range of transparent applications. Furthermore, the possibility to tailor this process through the versatility of ALD may of interest to avoid multifunctional coatings.

Figure 18:
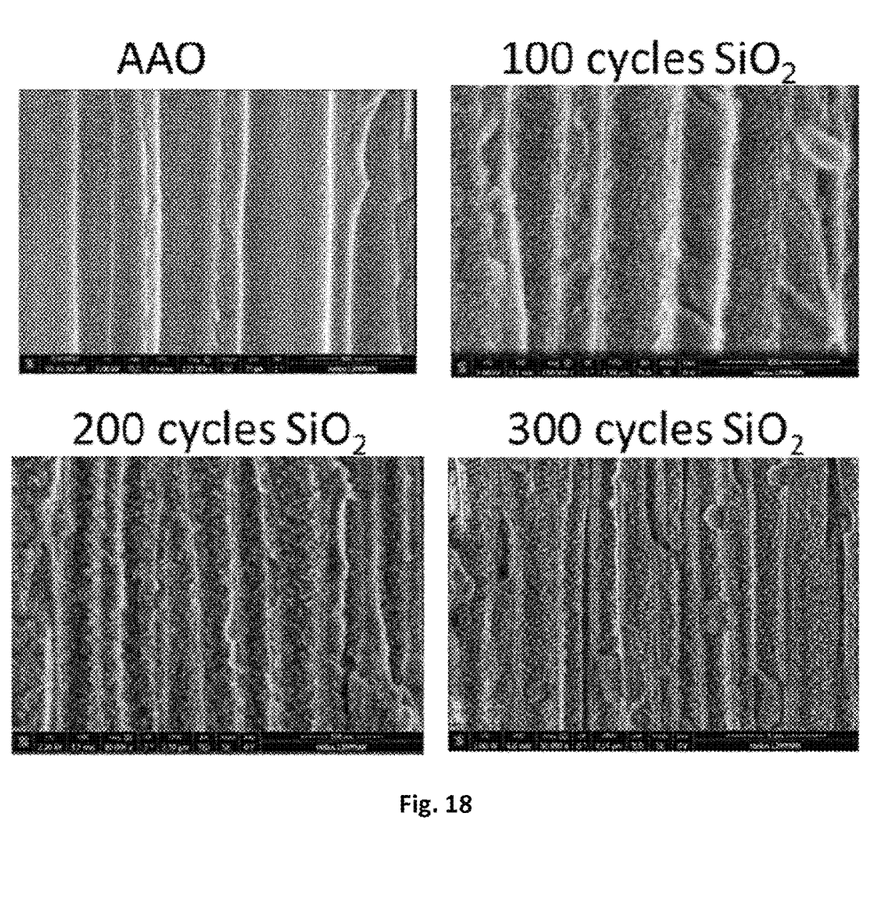
FIG. 18 exemplarily illustrates SEM images of various thickness ALD SiO$_2$ (100-300 loops) deposited on anodic aluminium oxide (AAO) membranes.

The evident interest of this porous $SiO_2$ layer has been applied to a 3D material. Various thickness of $SiO_2$ has been deposited on an anodic aluminium oxide (AAO) membrane and results are shown in FIG. 18. It clearly appears that the porosity obtained on planar substrates is transposed on 3D surfaces. This let suggest many applications that need hydrophilicity or low contaminants layer with a high precision on thickness deposited.

What is claimed is:
1. A method for atomic layer deposition for a coating of silicon oxide on a substrate, such as on an inorganic material, and performed at room temperature, involving at least three precursors, the at least three precursors being silicon tetrachloride, water and one Lewis base agent, said method comprising the sequential and non-overlapping steps of:
   a) exposing the one Lewis base agent to the substrate during a first exposure time;

b) exposing the silicon tetrachloride to the substrate during a second exposure time; and c) exposing the water to the substrate during a third exposure time, wherein a step of purging with nitrogen gas is performed after step (a), and at least one step of purging with nitrogen gas is performed after each of the steps (b) and (c) for obtaining a porous silicon dioxide film onto the substrate, wherein the level of chlorine contaminants is less than 3% of the total mass of the silicon dioxide film, and wherein each of the steps (a), (b) and (c) is performed at room temperature.

2. The film of silicon oxide according to claim 1, wherein the film of silicon oxide comprises pores.

3. The film of silicon oxide according to claim 2, wherein the pores are one of micropores, mesopores and nanopores.

4. The film of silicon oxide according to claim 1, wherein the film of silicon oxide comprises at least one of superhydrophilic properties, anti-reflective properties and insulating properties.

5. A method for atomic layer deposition for a coating of silicon oxide on a substrate, such as on an inorganic material, and performed at room temperature, involving at least three precursors, the at least three precursors being silicon tetrachloride, water and one Lewis base agent, said method comprising the sequential and non-overlapping steps of:

a) exposing the one Lewis base agent to the substrate during a first exposure time;

b) exposing the silicon tetrachloride to the substrate during a second exposure time; and c) exposing the water to the substrate during a third exposure time, wherein a step of purging with nitrogen gas is performed after step (a), and at least one step of purging with nitrogen gas is performed after each of the steps (b) and (c) for obtaining a porous silicon dioxide film onto the substrate, wherein the level of chlorine contaminants is less than 3% of the total mass of the silicon dioxide film, and wherein the porous film presents cavities of 20-50 nm.

* * * * *